US008633841B2

(12) United States Patent
Oonishi et al.

(10) Patent No.: US 8,633,841 B2
(45) Date of Patent: Jan. 21, 2014

(54) SIGNAL PROCESSING DEVICE, MASS SPECTROMETER, AND PHOTOMETER

(75) Inventors: Fujio Oonishi, Yokohama (JP); Yasushi Terui, Tsuchiura (JP); Tsukasa Shishika, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1 day.

(21) Appl. No.: 13/387,122

(22) PCT Filed: Aug. 30, 2010

(86) PCT No.: PCT/JP2010/005314

§ 371 (c)(1), (2), (4) Date: Feb. 14, 2012

(87) PCT Pub. No.: WO2011/030518

PCT Pub. Date: Mar. 17, 2011

(65) Prior Publication Data

US 2012/0154190 A1 Jun. 21, 2012

(30) Foreign Application Priority Data

Sep. 14, 2009 (JP) ................................ 2009-211242

(51) Int. Cl.
*H03M 1/62* (2006.01)

(52) U.S. Cl.
USPC .......................................... 341/139; 341/155

(58) Field of Classification Search
USPC .......................................... 341/139, 155, 156
See application file for complete search history.

(56) References Cited

U.S. PATENT DOCUMENTS

| | | | | |
|---|---|---|---|---|
| 5,926,124 | A | 7/1999 | Shimomura | |
| 6,943,548 | B1 * | 9/2005 | Hertz | 324/309 |
| 7,603,094 | B2 * | 10/2009 | Rahman et al. | 455/241.1 |
| 8,320,858 | B2 * | 11/2012 | Ruelke et al. | 455/130 |
| 2006/0289739 | A1 | 12/2006 | Oonishi et al. | |

FOREIGN PATENT DOCUMENTS

| | | |
|---|---|---|
| JP | 6-83541 | 3/1994 |
| JP | 9-166491 | 6/1997 |
| JP | 10-19848 | 1/1998 |
| JP | 2002-267490 | 9/2002 |
| JP | 2005-268152 | 9/2005 |
| JP | 2006-343319 | 12/2006 |
| JP | 2008-249694 | 10/2008 |

OTHER PUBLICATIONS

Joel Kimmel et al., Quantitative Time-of-flight Mass Spectrometry of Aerosols Using a Digitally Thresholded Analog-to-Digital Converter, American Society for Mass Spectrometry, 2006.

* cited by examiner

*Primary Examiner* — Brian Young
(74) *Attorney, Agent, or Firm* — Antonelli, Terry, Stout & Kraus, LLP.

(57) ABSTRACT

A signal processing device includes amplifiers that are capable of amplifying detected signals using amplification factors that are different from each other; A/D converters that sample plural signals amplified by the amplifiers using the different amplification factors and output from the amplifiers; calculators that perform, on the basis of the amplification factors of the plural amplifiers, calculation on plural data pieces converted by the A/D converters; and a selector that selects one or more of output data pieces from among plural data pieces output from the calculators.

10 Claims, 9 Drawing Sheets

SIGNAL PROCESSING DEVICE, MASS SPECTROMETER, AND PHOTOMETER

TECHNICAL FIELD

The present invention relates to a signal processing device, and a mass spectrometer and a photometer which use the signal processing device. More particularly, the invention relates to a signal processing device used in a mass spectrometry detection system and in a photometer each of which use an analog-to-digital (A/D) converter included in a time-of-flight mass spectrometer.

BACKGROUND ART

A time-of-flight mass spectrometer (TOF-MS) includes an introduction unit, a TOF unit, a gain adjuster, an ion extraction signal generator and a data collecting circuit, and analyzes a component contained in the sample by ionizing the sample, accelerating the ionized sample, causing the ion of the sample to fly, and measuring a flying time and intensity (voltage value) of the ion on the basis of a mass of the ion.

In analysis performed by the TOF-MS, the sample to be analyzed is first ionized by the introduction unit and then sent into the TOF unit at the same time as the measurement start time. A voltage is applied to the ion introduced in the introduction unit when an ion extraction signal is provided, so that the ion flies along a predetermined orbit in the TOF unit that is in a vacuum state.

When the ion reaches (collides with) a detector included in the TOF unit, the detector outputs a detected ion signal. The amplitude of the detected ion signal is adjusted by a gain adjuster or the like and collected by a data collecting circuit that includes an A/D converter. The data collected by the data collecting circuit is output to an input/output device through a CPU. Results of the measurement are displayed as a mass spectrum. The component contained in the sample can be analyzed on the basis of intensities (voltage values) of the spectrum and times (masses) corresponding to the intensities.

Normally, for the TOF-MS, measurement sensitivity (S/N ratio) of spectrum data obtained by a single measurement is not sufficient in many cases. Therefore, the measurement is performed plural times and an accumulation process is performed so as to obtain a mass spectrum and improve the measurement sensitivity.

Hereinafter, a measurement to be performed to obtain a mass spectrum is called a mass spectrum measurement, and a single measurement is called TOF scan. The TOF scan is to collect data about ion accelerated in accordance with a single ion acceleration signal, with the data output from the detector, that is, to collect spectrum data for a time period from a time t0 (when the ion is accelerated) to a time t1.

In recent years, there has been a demand for a data collecting circuit, which uses an A/D converter to obtain such a mass spectrum as described above, to have a high dynamic range in order to improve mass spectrometry.

This is due to the fact that there has been a demand for the aforementioned TOF scan to perform detection of one to several hundred ions simultaneously during one scan time. Thus, it is difficult to detect a signal while ensuring a desired signal-to-noise (SN) ratio within an input range for a single A/D converter. As a method for avoiding this, for example, Patent Literature 1 (JP-A-2005-268152) discloses "a data processing device for mass spectrometry, which is included in a time-of-flight mass spectrometer, the processing device including: an A/D converter that samples a detected signal; a first determining circuit that performs a level determination operation on data sampled by the A/D converter using a predetermined threshold so as to divide the data into two components; an accumulation memory that stores data whose levels are equal to or higher than the threshold while performing an accumulation process on the data; and a second determining circuit that accumulates data whose levels are lower than the threshold, performs the level determination operation on the accumulated value using the threshold, and causes data whose levels are equal to or higher than the threshold to be stored in the accumulation memory".

In addition, for a signal detected by a photomultiplier known as a photometer, since the intensity of the signal varies depending on a wavelength of light, it is difficult for a single A/D converter to detect a signal in some cases. As a method for avoiding this, for example, Patent Literature 2 (JP-A-H09-166491) discloses "an interferogram processing method in which an interferogram that is output from an analyzer is simultaneously sampled by plural gain amplifiers that use gains that are different from each other, percentages of data series of the gains which are different from each other are gradually changed at around the time when the gains are switched during a combination of the sampled data".

CITATION LIST

Patent Literature

Patent Literature 1: JP-A-2005-268152
Patent Literature 2: JP-A-H09-166491

Non-Patent Literature

Non-Patent Literature 1: 2006 ASMS (American Society for Mass Spectrometry) Quantitative Time-of-flight Mass Spectrometry of Aerosols Using a Digitally Thresholded Analog-to-Digital Converter

SUMMARY OF INVENTION

Technical Problem

After the present inventors have studied such a TOS-MS as described above, the inventors found out that conventional mass spectrometers have the following problems.

(1) In a case where one to one hundred ions are detected at one time, if it is assumed that an input voltage range for an A/D converter is 500 mV and a single ion has a voltage of 20 mV, it is necessary that 100 ions have an amplitude of 2000 mV. In this case, the input range for the A/D converter needs to be multiplied by four. Generally, although the gain for the A/D converter is set to ¼ for the maximum amplitude of a signal, the amplitude of a single ion, in this case, is 5 mV. Thus, when a noise voltage of the A/D converter is approximately 10 mV, the noise voltage is higher than the amplitude of the ion, and whereby a sufficient S/N ratio cannot be ensured.

(2) In addition, when plural A/D converters different in gain factor with each other are used to sample signals and an appropriate gain is selected for performing an accumulation process, a consideration has not been paid, in a conventional technique, for selecting a sampling path that causes a lower amount of noise from among plural sampling paths.

(3) Further, although A/D converters different in gain factor are used, a consideration has not been paid for a circuit for correcting a measurement error caused by predetermined gain factors to be used in paths including the A/D converters and a measurement error caused by a difference between the phases of sampling clocks in the paths.

(4) Still further, for an ADC circuit that includes plural A/D converters, a technique for equivalently increasing sampling speeds has not been considered.

(5) Still further, in a case where plural A/D converter are used, when a variation in the amplitudes of ion signals is small in paths using different gains and the signals do not need to be sampled by the plural A/D converters.

A conventional photometer has the same problems as described in items (1) to (5).

It is, therefore, an object of the present application to provide a technique for increasing a dynamic range that is a range in which a sampled ion signal is detected in a data processing device that is included in a time-of-flight mass spectrometer and uses an A/D conversion scheme. The aforementioned object of the present application, another object of the present application, and new characteristics will be apparent from this description and the accompanying drawings.

Solution to Problem

A representative outline of the present invention disclosed herein is briefly described as follows.

(1) A signal processing device includes: amplifiers that are capable of amplifying a detected signal using amplification factors that are different from each other; A/D converters that sample plural signals amplified by the amplifiers using the different amplification factors and output from the amplifiers; calculators that perform, on the basis of the plural amplification factors of the amplifiers, calculation on plural data pieces converted by the A/D converters and output from the A/D converters; and a selector that selects one or more of output data pieces from among plural data pieces output from the calculators.

Advantageous Effect of Invention

According to the present invention disclosed in the present application, a high dynamic range can be achieved.

DESCRIPTION OF EMBODIMENTS

Figure 1:
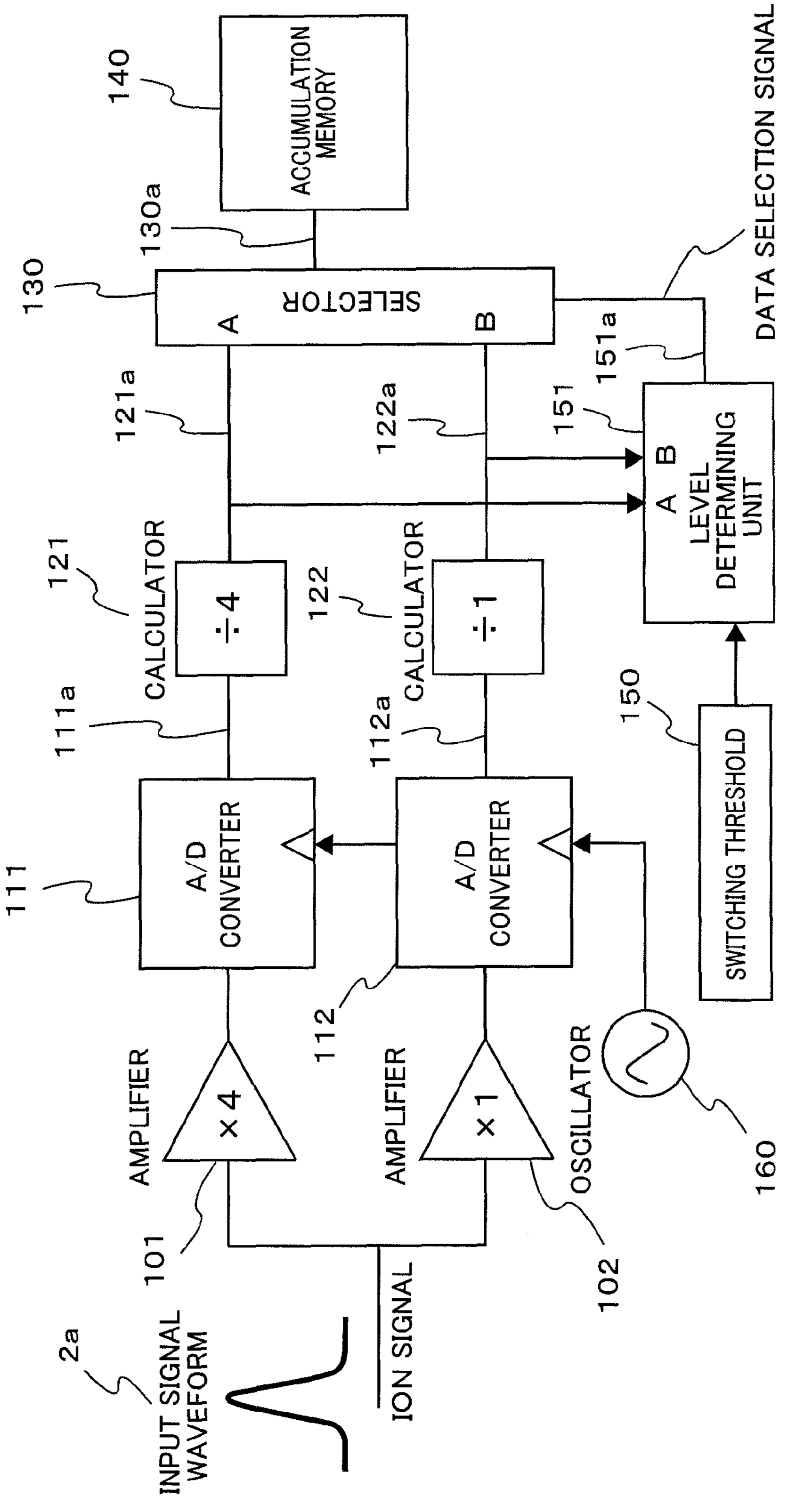
FIG. 1 is a diagram illustrating an example of the configuration of a mass spectrometer according to a first embodiment, which includes a data processing device for mass spectrometry, the device using an A/D conversion scheme.

Embodiments of the present invention are described in detail below with reference to the accompanying drawings. In all the drawings that are used to explain the embodiments, the same members are indicated by the same reference numerals in principle, and a repeated description thereof is omitted.

First Embodiment

FIG. 1 is a diagram illustrating an example of the configuration of a mass spectrometer according to a first embodiment, which includes a data processing device for mass spectrometry, the device using an A/D conversion scheme.

The mass spectrometer according to the first embodiment is a time-of-flight mass spectrometer. The data processing device for mass spectrometry, which is included in the time-of-flight mass spectrometer, and a data processing method are described below.

A data collecting circuit that is included in the mass spectrometer according to the first embodiment includes amplifiers 101 and 102, oscillator 160, A/D converters 111 and 112, calculators 121 and 122, a selector 130, a level determining unit 151, an accumulation memory 140. The amplifiers 101 and 102 use predetermined gains to amplify a waveform 2*a* of an input ion signal. The oscillator 160 outputs a clock. The A/D converters 111 and 112 each receive the clock from the oscillator 160 and sample signals output from the amplifiers 101 and 102, respectively. The calculators 121 and 122 perform back calculation so as to divide data 111*a* and 112*a* output from the A/D converters 111 and 112 by amplification factors. The selector 130 selects any of data 121*a* and 122*a* output from the calculators 121 and 122 on the basis of a data selection signal 151*a*. The level determining unit 151 generates the data selection signal 151*a* on the basis of the data 121*a* and 122*a* output from the calculators 121 and 122 and a switching threshold 150. The accumulation memory 140 performs an accumulation process on a signal 130*a* selected by the selector 130.

Figure 2:
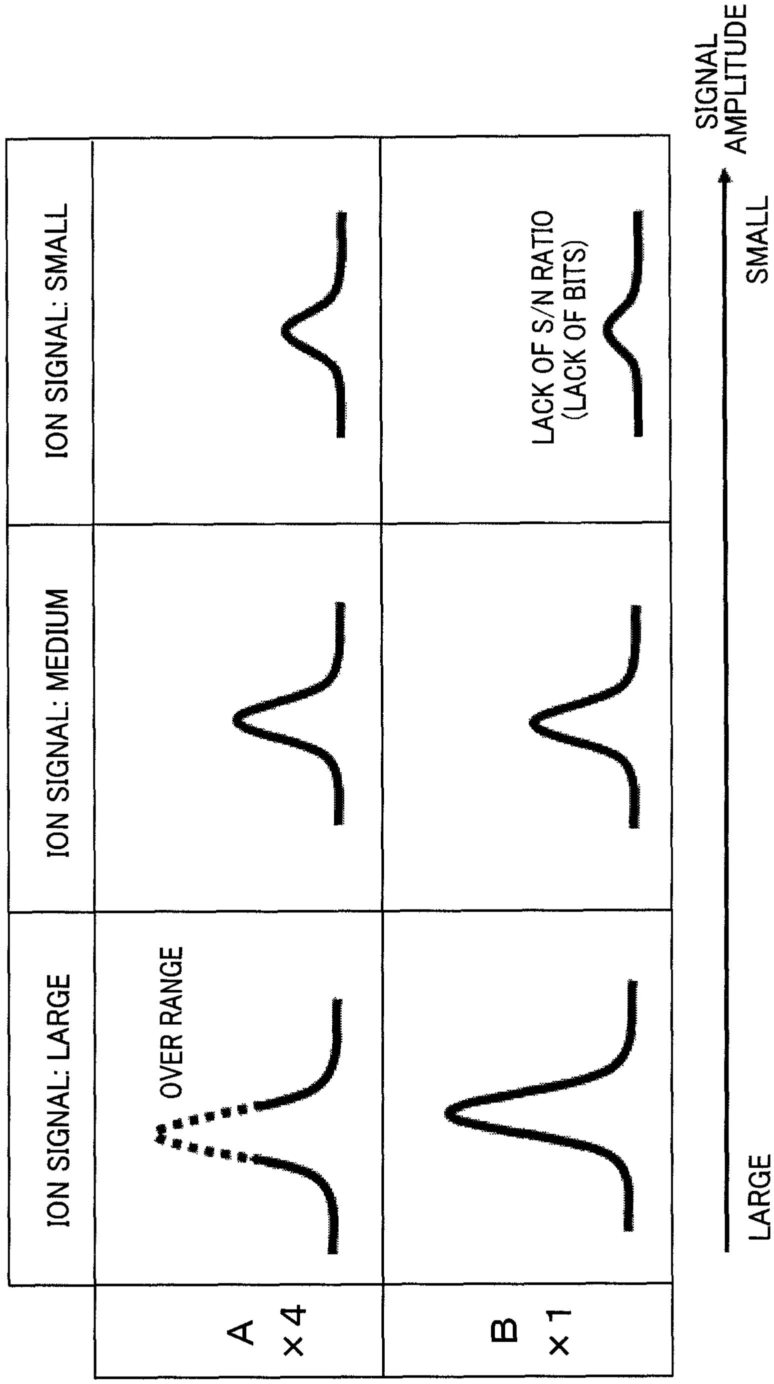
FIG. 2 is a diagram illustrating results obtained by sampling detected ion signals in the first embodiment.

Next, the selection that is performed by the selector 130 is described with reference to FIG. 2. FIG. 2 illustrates the waveforms of ion signals different in amplitude from each other. An ion signal indicated by "large" has amplitude that is larger than an amplitude of an ion signal indicated by "medium" and an amplitude of an ion signal indicated by "small". The ion signal indicated by "medium" has the amplitude that is larger than the amplitude of the ion signal indicated by "small". In addition, symbols "A" and "B" indicate the types of inputs to the selector.

When the ion signal with the large amplitude passes through the A/D converter 111, the amplitude of the ion signal becomes excessively large to be an over range. When the ion signal with the small amplitude passes through the A/D converter 112, the amplitude of the ion signal becomes excessively small and an S/N ratio is degraded due to the insufficient amplitude. Since the ion signal indicated by "medium" has the medium amplitude, any of the inputs "A" and "B" of the selector 130 may be used for the ion signal with the medium amplitude.

A method for switching the inputs to the selector 130 when the amplitude of an ion signal becomes an over range after the ion signal passes through the A/D converter 111 is described below.

As a specific example, the following case is described, in which the amplifier 101 multiplies the amplitude of a signal by 1, the amplifier 102 multiplies the amplitude of a signal by ¼, input full scales for the A/D converters are 500 mV, the calculator 121 multiplies the amplitude of the signal by 1, and the calculator 122 multiplies the amplitude of the signal by 4. When the voltage of an ion signal is 2V, the voltage of the signal to be input to the A/D converter 111 is 2V that is an over range, and a path that is located on the input "B" side of the selector 130 is selected. When the voltage of a signal output from the A/D converter 111 is in the range, an output that is located on the input "A" side of the selector 130 is used. Thus, ion signals that have voltages in a range of 20 mV to 2 V can be detected. In the first embodiment, the dynamic range for the mass spectrometer can be quadrupled.

Next, a method for determining the switching threshold according to the first embodiment is described. As illustrated in FIG. 2, any of the inputs "A" and "B" of the selector 130 can be set when the ion signal with the medium amplitude is input. An example in which the selector 130 selects a signal having a higher S/N ratio is described with reference to FIG. 1.

The amplifier 102 multiplies the amplitude of a signal by 1 and it is not necessary to amplify the amplitude in the circuit. The amplifier 102 is only connected and does not cause superimposed noise. On the other hand, since the amplifier 101 multiplies the amplitude of a signal by four, noise of the amplifier 101 is superimposed on the input ion signal. As an example, it is assumed that the amount of noise generated due to sampling in a path (non-amplification path) that includes the amplifier 102 is 10 mV and the amount of noise generated due to sampling in a path (quadruple amplification path) that includes the amplifier 101 is 11 mV. In addition, when the A/D converters each have an ideal voltage resolution of 1 mV, a quantization error in the non-amplification path is 1 mV, and a quantization error in the quadruple amplification path is 0.25 mV that is one fourth of the quantization error in the non-amplification path. This is due to the fact that the calculator 121 performs the back calculation to divide the amplitude of the signal by four. In this case, the total amount of the noise generated in the non-amplification path and the quantization error in the non-amplification path is 11 mV, while the total amount of the noise generated in the quadruple amplification path and the quantization error in the quadruple amplification path is 11.25 mV. In this case, it is preferable that the switching threshold be set so that the quadruple amplification path is not used as much as possible. In order to avoid this, the difference between the quantization error in the non-amplification path and the quantization error in the quadruple amplification path can be increased by increasing the amplification factor to be used for the path that includes the amplifier 102.

As described above, in a case where paths for different amplification factors are used, which are normally employed, a path for a higher amplification factor is selected if the amplitudes of signals input to the A/D converters are in the range. However, unlike the aforementioned example, an S/N ratio of a signal within the path of the higher amplification factor is not necessarily higher than an S/N ratio of a signal within the other path.

According to the first embodiment, the switching threshold that is used in the first embodiment is determined on the basis of results of measuring the amounts of noise in the paths and the quantization errors in the paths before a measurement. Thus, sampling of a signal having a high S/N ratio can be achieved.

In the time-of-flight mass spectrometer according to the first embodiment, the data processing device for mass spectrometry which uses the A/D conversion scheme, each use plural A/D converters, simultaneously samples detected ion signals amplified using the different gains, and can thereby select a result of the sampling so that the selected result has a higher S/N ratio. Thus, a high dynamic range can be achieved. In addition, the amounts of noise within the sampling paths in which sampling is performed on signals amplified using the different gains may be measured, and the data processing device may include a level determining circuit that selects a signal having a higher S/N ratio. Thus, the high dynamic range can be achieved.

Second Embodiment

Figure 3:
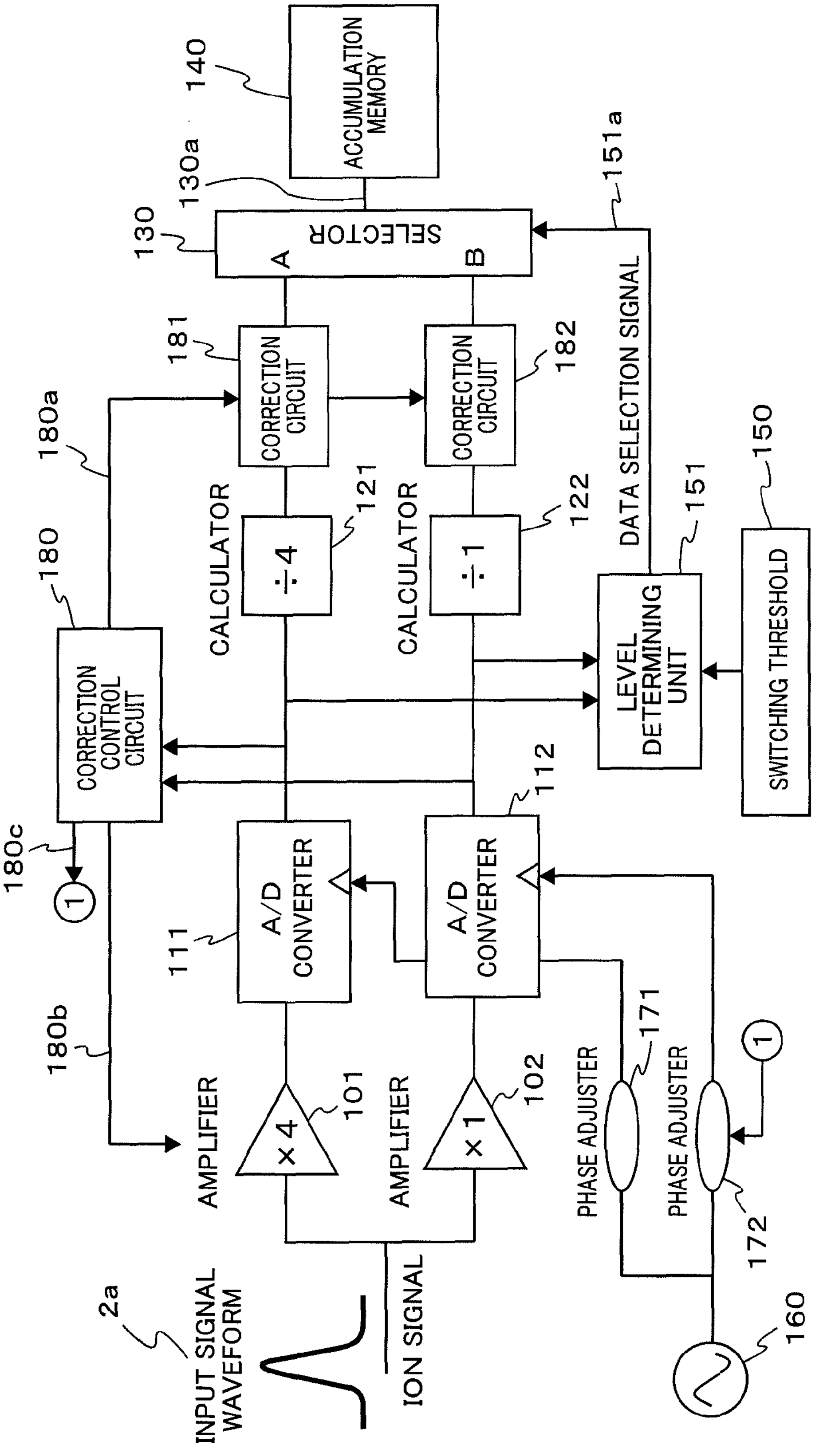
FIG. 3 is a diagram illustrating an example of the configuration of a mass spectrometer according to a second embodiment, which includes a data processing device for mass spectrometry, the device using the A/D conversion scheme.

FIG. 3 is a diagram illustrating an example of the configuration of a mass spectrometer according to a second embodiment of the present invention. The mass spectrometer according to the second embodiment includes a data processing device that uses the A/D conversion scheme and is provided for mass spectrometry. The second embodiment describes an example in which an error of the gains to be used in plural paths is corrected.

A data collecting circuit according to the second embodiment includes, as a basic configuration, the amplifiers 101 and 102, the A/D converters 111 and 112, the calculators 121 and 122, the selector 130, the level determining unit 151 and the accumulation memory 140, which are the constituent elements described in the first embodiment. The amplifiers 101 and 102 amplify the amplitudes of ion signals using the predetermined gains. The A/D converters 111 and 112 sample signals output from the amplifiers 101 and 102, respectively. The calculators 121 and 122 perform the back calculation to divide data output from the A/D converters 111 and 112 by the amplification factors. The selector 130 selects, on the basis of the data selection signal 151*a*, data from among data output from the calculators 121 and 122. The level determining unit 151 generates the data selection signal 151*a* on the basis of the data output from the calculators 121 and 122 and the switching threshold 150. The accumulation memory 140 performs an accumulation process on a signal selected by the selector 130. In addition, the data collecting circuit according to the second embodiment includes a correction control circuit 180, correction circuits 181 and 182, and phase adjusters 171 and 172.

In the second embodiment, in a path that includes the A/D converter 111, after the amplifier 101 multiplies the amplitude of a signal by four, the calculator 121 performs the back calculation so as to divide the amplitude of the signal by four. However, the amplitude that is amplified by the amplifier 101 may not be accurately multiplied by four due to a variation in characteristics of parts, compared with the amplification factor that is 1 and used by the amplifier 102. The correction circuit 181 corrects this error. The correction circuit 181 calculates a correction value that is the difference between the amplitude accurately multiplied by four and the amplitude actually amplified by the amplifier 101. In addition, when the amplification factor is only 3.9, the correction control circuit 180 performs a calculation so that the amplitude is multiplied by four. In other words, the correction control circuit 180 calculates an error of the amplification factor before a measurement and performs a calculation to correct the error during the measurement. In addition, in order to calculate the error of the amplification factor, a known standard signal such as a sine wave is input to the data collecting circuit from the outside of the data collecting circuit. In addition, a standard signal generating circuit for generating a standard signal may be included in the data collecting circuit, and means for receiving the standard signal instead of an ion signal may be included in the data collecting circuit. As described above, in the second embodiment, a deviation of an amplification factor from a predetermined amplification factor can be corrected in the plural paths for the different amplification factors.

In the time-of-flight mass spectrometer according to the second embodiment, the data processing device for mass spectrometry which uses the A/D conversion scheme and the data processing device, each include the circuit for correcting the gains and clock phases in the signal sampling paths each of which are provided for each of the plural A/D converters, and can thereby obtain an accurate amplitude of a signal and the timing of sampling of the signal so that the signal can be detected with high accuracy.

Third Embodiment

Figure 4:
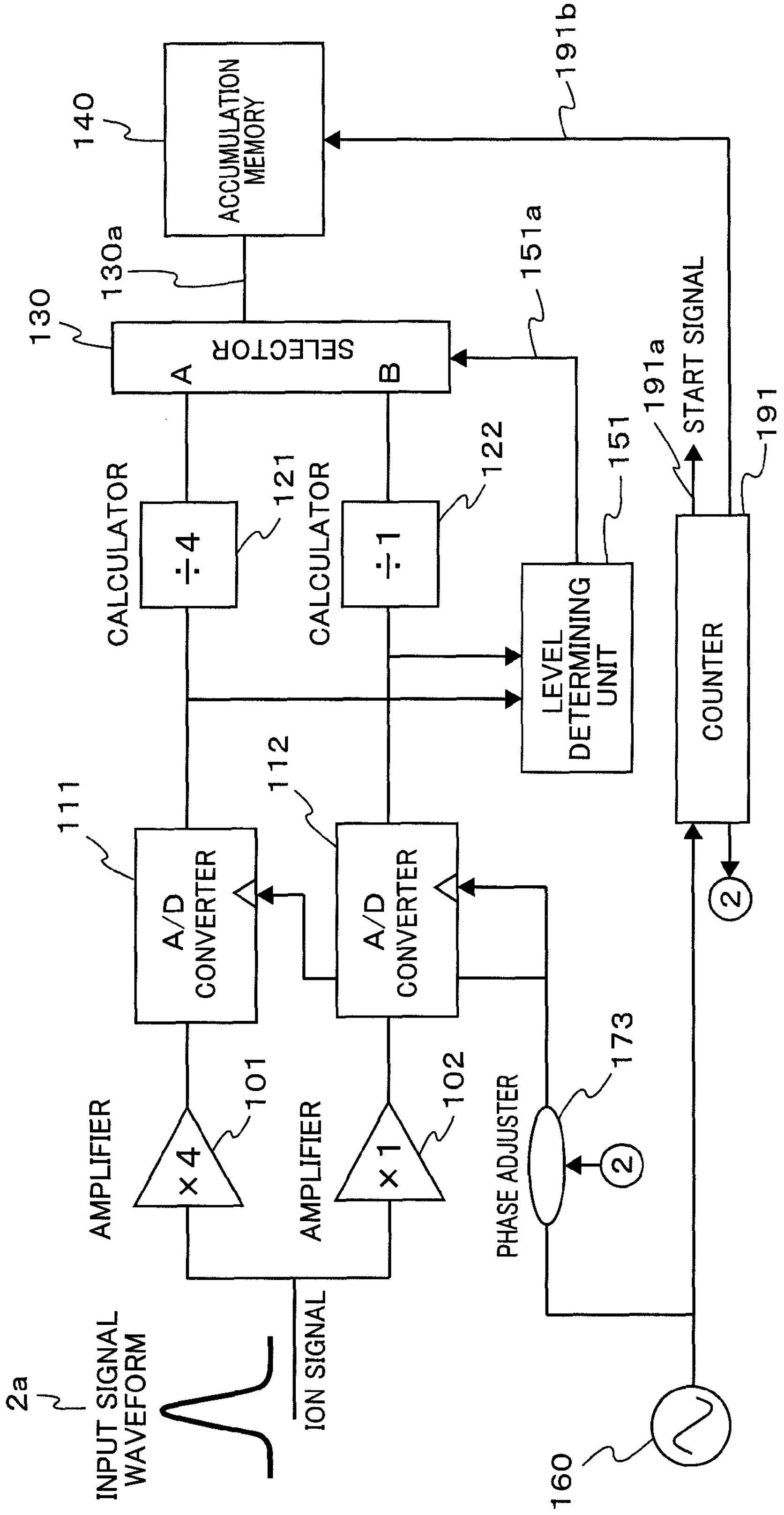
FIG. 4 is a diagram illustrating an example of the configuration of a mass spectrometer according to a third embodiment, which includes a data processing device for mass spectrometry, the device using the A/D conversion scheme.

A third embodiment is described below with reference to FIG. 4. The third embodiment describes an example in which a sampling resolution is improved in a data collecting circuit including plural sampling paths without increasing a sampling frequency.

The data collecting circuit according to the third embodiment includes, as the basis configuration, the amplifiers 101 and 102, the A/D converters 111 and 112, the calculators 121 and 122, the selector 130, the level determining unit 151 and the accumulation memory 140, which are the constituent elements described in the first embodiment. The amplifiers 101 and 102 amplify the amplitudes of ion signals using the predetermined gains. The A/D converters 111 and 112 sample signals output from the amplifiers 101 and 102, respectively. The calculators 121 and 122 perform the back calculation to divide data output from the A/D converters 111 and 112 by the amplification factors. The selector 130 selects, on the basis of the data selection signal 151*a*, data from among data output from the calculators 121 and 122. The level determining unit 151 generates the data selection signal 151*a* on the basis of the data output from the calculators 121 and 122 and the switching threshold. The accumulation memory 140 performs accumulation process on a signal 130*a* selected by the selector 130. In addition, the data collecting circuit according to the third embodiment includes a clock phase adjuster 173 and a counter 191. The clock phase adjuster 173 according to the third embodiment shifts a phase of a sampling clock so that the phase of the sampling clock to be used for even scan is shifted by a half of the phase from the phase of the sampling clock to be used for odd scan. In addition, the counter 191 operates in synchronization with a sampling clock and has a function of outputting a start signal 191*a* that causes sampling to start.

Figure 5:
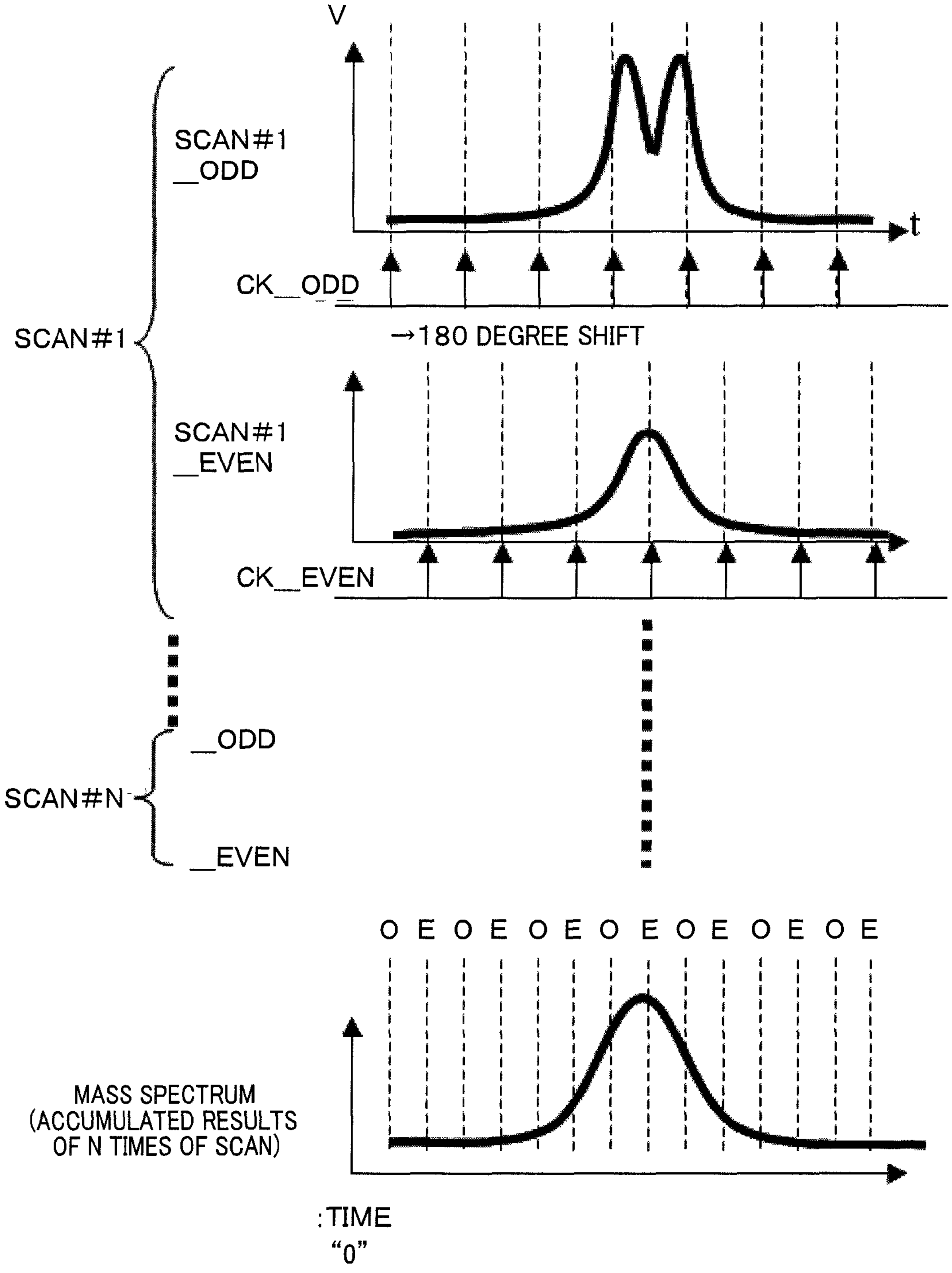
FIG. 5 is a diagram illustrating results obtained by sampling detected ion signals in the third embodiment.

An example of operations to be performed in the third embodiment is described with reference to FIG. 5. The number of times of scan illustrated in FIG. 5 is 2N. In FIG. 5, a combination of an odd time of scan (SCAN #1 ODD to #N ODD) and an even time of scan (SCAN #1 Even to #N Even) is treated as scan to be performed in one time. Thus, the scan is indicated by SCAN #1 to #N. When CK ODD illustrated in FIG. 5 is generated at a time corresponding to a phase that is not shifted, CK Even is generated at a time corresponding to a phase shifted by 180 degrees. In addition, FIG. 5 illustrates a waveform of a signal sampled by scan SCAN #1 ODD and a waveform of a signal sampled by scan SCAN #1 Even. Data of signals having such waveforms as illustrated in FIG. 5 is sampled by scan up to scan SCAN #N. A lower part of FIG. 5 illustrates accumulated results (mass spectrum) of sampling the waveforms. As illustrated in FIG. 5, the contents stored in the accumulation memory chronologically indicate the results of alternately sampling the waveforms in the odd scan and the even scan.

As described above, sampling intervals can be equivalently reduced by half by the operations of the data collecting circuit, and high-resolution sampling can be achieved by the operations of the data collecting circuit.

In the time-of-flight mass spectrometer according to the third embodiment, the data processing device for the mass spectrometry which uses the A/D conversion scheme, each use the plural A/D converters to achieve a high dynamic range by first achieving means (according to the present invention). In addition, the data processing device performs the sampling, while the phase of the sampling clock to be used for the even scan is shifted by 180 degrees from the phase of the sampling clock to be used for the odd scan. Furthermore, the data processing device has a function of equivalently reducing the sampling intervals by half by performing the scan twice and can thereby achieve both high dynamic range and high-resolution sampling.

Fourth Embodiment

Figure 6:
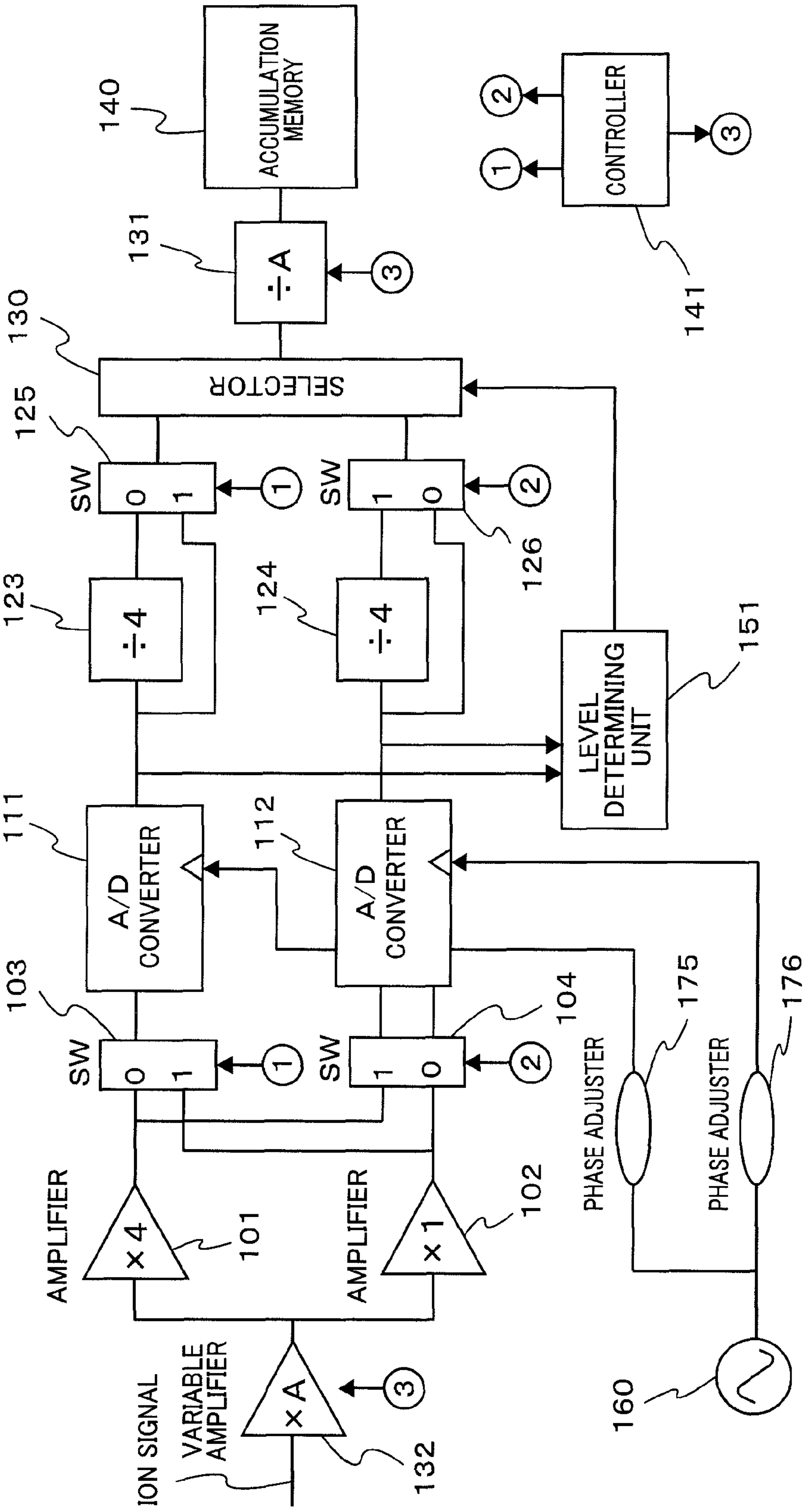
FIG. 6 is a diagram illustrating an example of the configuration of a mass spectrometer according to a fourth embodiment, which includes a data processing device for mass spectrometry, the device using the A/D conversion scheme.

A fourth embodiment is described below with reference to FIG. 6. The fourth embodiment describes an example in which a data collecting circuit that includes plural sampling paths has a mode (hereinafter referred to as high dynamic range mode) for increasing input ranges for plural A/D converters 111 and 112 with respect to the intensity of an ion signal as described in the first embodiment and a mode (hereinafter referred to as high resolution mode) for doubling a time resolution of sampling and can switch the modes on the basis of a characteristic for analysis.

The data collecting circuit according to the fourth embodiment includes, as the basis configuration, the amplifiers 101 and 102, the A/D converters 111 and 112, calculators 123, 124, the selector 130, the level determining unit 151 and the accumulation memory 140, which are the constituent elements described in the first embodiment. The amplifiers 101 and 102 amplify the amplitudes of ion signals using the predetermined gains. The A/D converters 111 and 112 sample signals output from the amplifiers, respectively. The calculators 123 and 124 perform the back calculation to divide data output from the A/D converters 111 and 112 by the amplification factors. The selector 130 selects data from among data output from the calculators 123 and 124 on the basis of the data selection signal. The level determining unit 151 generates the data selection signal on the basis of the data output from the calculators 123 and 124 and the switching threshold. The accumulation memory 140 performs the accumulation process on a signal selected by the selector 130. In addition, the data processing device according to the fourth embodiment includes a variable amplifier 132, switches (SWs) 103 and 104, phase adjusters 175 and 176, the calculators 123 and 124, selectors 125 and 126, a calculator 131 and a controller 141. The variable amplifier 132 adjusts the amplitude of an ion signal. The phase adjusters 175 and 176 each adjust the phase of a sampling clock.

The clock phase adjusters 175 and 176 according to the fourth embodiment generate clocks having the same phase when the mode of the data collecting circuit is the high dynamic range mode. When the mode of the data collecting circuit is the high resolution mode, the clock phase adjusters 175 and 176 according to the fourth embodiment control clocks received from the oscillator 160 so that the phase of one of the clocks to be transferred to the A/D converter 111 is not shifted and the phase of the other clock to be transferred to the A/D converter 112 is shifted by 180 degrees.

In addition, the switches 103 and 104 each select an input "0" side of the switch when the mode of the data collecting circuit is the high dynamic range mode. When the mode of the data collecting circuit is the high resolution mode, the switches 103 and 104 are controlled so that the A/D converters 111 and 112 select the same amplifier. In addition, when the mode of the data collecting circuit is the high dynamic range mode, the selectors 125 and 126 each select the input "0" side of the selector. When the mode of the data collecting circuit is the high resolution mode, the selectors 125 and 126 each select a path in which a back calculation can be performed using the amplification factor of the amplifier selected by the switches 103 and 104. For example, when the amplifier 101 is selected, the switch 103 selects the input "0" side of the switch 103, the switch 104 selects an input "1" side of the switch 104, the selector 125 selects the input "0" side of the selector 125, and the selector 126 selects an input "1" side of the selector 126. The switches are controlled by the controller 141. In addition, the variable amplifier 132 is an amplitude adjusting circuit that flexibly supports a change in the amplitude of an ion signal. The variable calculator 131 performs a calculation to reduce the amplitude of the ion signal by an amount increased by the variable amplifier 132. The calculator 131 is installed to have a function that enables a signal to be stored in the accumulation memory 140 and added to signals stored in the accumulation memory 140 even when the amplification factor is changed during the measurement.

When the data collecting circuit is operated as described above, the high-dynamic-range operational mode or the high-resolution operational mode can be achieved.

In the time-of-flight mass spectrometer according to the fourth embodiment, the data processing device for mass spectrometry which uses the A/D conversion scheme and the data processing device, each use the plural A/D converters to improve functions to be used in the analysis modes of the mass spectrometer, since the device has means for selecting a mode in which the first achieving means selects a mode for increasing input ranges for the plural A/D converters with respect to voltages or a mode in which the plural A/D converters are used to increase a sampling resolution.

Fifth Embodiment

Figure 7:
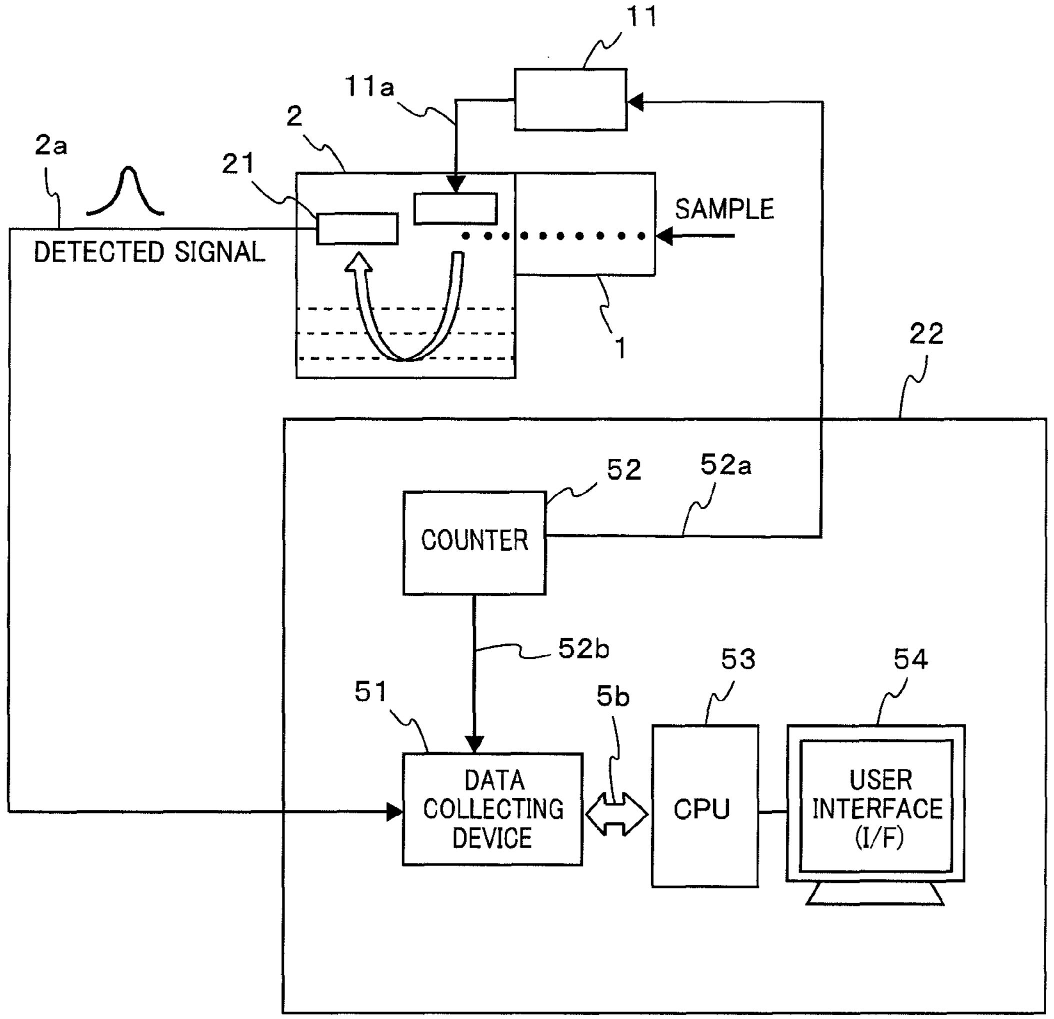
FIG. 7 is a diagram illustrating an example of the configuration of a mass spectrometer which includes the data processing device that is described in any of the first to fourth embodiments, the device using the A/D conversion scheme.

FIG. 7 is a diagram illustrating the configuration of a mass spectrometer when the data processing device according to any of the first to fourth embodiments is applied to the mass spectrometer.

First, a case in which the data processing device according to the first embodiment is applied to a mass spectrometer is described below.

The mass spectrometer illustrated in FIG. 7 includes an introduction unit 1, a TOF unit 2, an ion extraction signal generator 11 and a data processing device 22. The introduction unit 1 ionizes a sample to be analyzed. The TOF unit 2 applies a voltage to the ionized sample so as to accelerate ions of the sample to fly toward a detector. The ion extraction signal generator 11 generates an ion extraction signal 11*a* to determine the time when the ions are accelerated. The data processing device 22 processes a detected ion signal 2*a* output from the TOF unit 2 and analyzes a measurement result.

The TOF unit 2 includes the detector 21 that detects ions flying to the detector 21. In addition, the data processing device 2 includes a gain adjuster 3, a data collecting device 51, a CPU 53, an input/output device (user interface) 54 and a counter 52. The gain adjuster 3 adjusts the amplitude of the detected ion signal 2*a* output from the TOF unit 2. The data collecting device 51 measures and collects a voltage value of the detected ion signal having the adjusted amplitude and a flying time for the detected ion signal having the adjusted amplitude. The CPU 53 controls the data collecting device 51 and analyzes and processes data 5*b* acquired from the data collecting device 51. The input/output device (user interface) 54 displays results of the measurement and results of the analysis and is used by a user to control the device. The counter 52 counts a time for signal sampling.

The counter 52 counts the time for the signal sampling and operates in synchronization with the timing of an ion extraction. A signal 52*a* that is output from the counter 52 is used as an address to be transmitted to the accumulation memory 140 (illustrated in FIG. 1) included in the data collecting circuit (ADC circuit) 51 and corresponds to a time axis of the mass spectrum obtained after the ion signal sampling.

Next, the data processing device described in the second embodiment can be applied to the mass spectrometer illustrated in FIG. 7 in the same manner as described above.

Next, a case in which the data processing device described in the third embodiment is applied to the mass spectrometer is described below. The data processing device described in the third embodiment has therein the counter 191 as illustrated in FIG. 4. The counter 191 has the same function as the counter 52 illustrated in FIG. 7. When the data collecting device described in the third embodiment is applied to the mass spectrometer according to the fifth embodiment, the counter 52 is not necessary. In this case, the start signal 191*a* output from the counter 191 is used instead of the ion extraction signal 52*a*.

The data processing device described in the fourth embodiment can be applied to the mass spectrometer illustrated in FIG. 7 in the same manner as described above.

Sixth Embodiment

Figure 8:
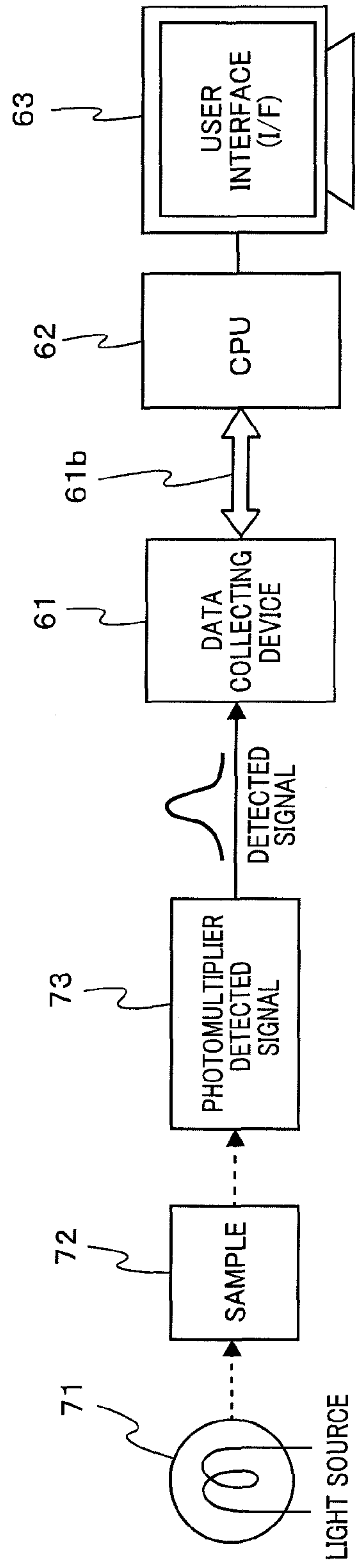
FIG. 8 is a diagram illustrating an example of the configuration of a photometer which includes the data processing device that is described in any of the first to fourth embodiments, the device using the A/D conversion scheme.

FIG. 8 is a diagram illustrating the configuration of a photometer when the data processing device according to any of the first to fourth embodiments is applied to the photometer.

First, a case in which the data processing device according to the first embodiment is applied to a photometer is described.

The photometer illustrated in FIG. 8 includes a light source 71, a sample 72, a photomultiplier 73, a data collecting device 61, a CPU 62 and a user interface (I/F) 63. The light source 71 is used to measure a luminous intensity of light. The sample 72 is to be measured. The photomultiplier 73 detects a luminous intensity of light having a desired wavelength through spectroscopy. The data collecting device 61 samples a signal detected by the photomultiplier 73 and stores a result of sampling the signal. The CPU 62 controls the data collecting device 61 and performs control to analyze and process data 61*b* acquired from the data collecting device 61. The user interface (I/F) 63 displays a result of the measurement and a result of the analysis and is used by a user to control the device.

When the data processing device according to the first embodiment is applied to the photometer, the data processing device 61 illustrated in FIG. 8 is replaced with the data processing device (illustrated in FIG. 1) according to the first embodiment. Thus, the signal that is output from the photomultiplier 73 illustrated in FIG. 7 is treated as the input signal illustrated in FIG. 1.

As a method for storing data in the accumulation memory 140 (illustrated in FIG. 1) included in the photometer, for example, the intensity of a detected signal is stored for each of the wavelengths with addresses of the accumulation memory 140 associated with wavelengths. In this case, when it is assumed that the intensity of a detected signal is stored for each of wavelengths of 200 nm to 900 nm on a nanometer basis for example, the accumulation memory 140 has 700 addresses and an accumulated value of sampling results for a predetermined time period is stored for each of the addresses. When a measurement is performed for a time period of 1 ms and sampling intervals are 1 ns for example, a total voltage value for one million sampling points is stored at a predetermined address of the accumulation memory 140.

Figure 9:
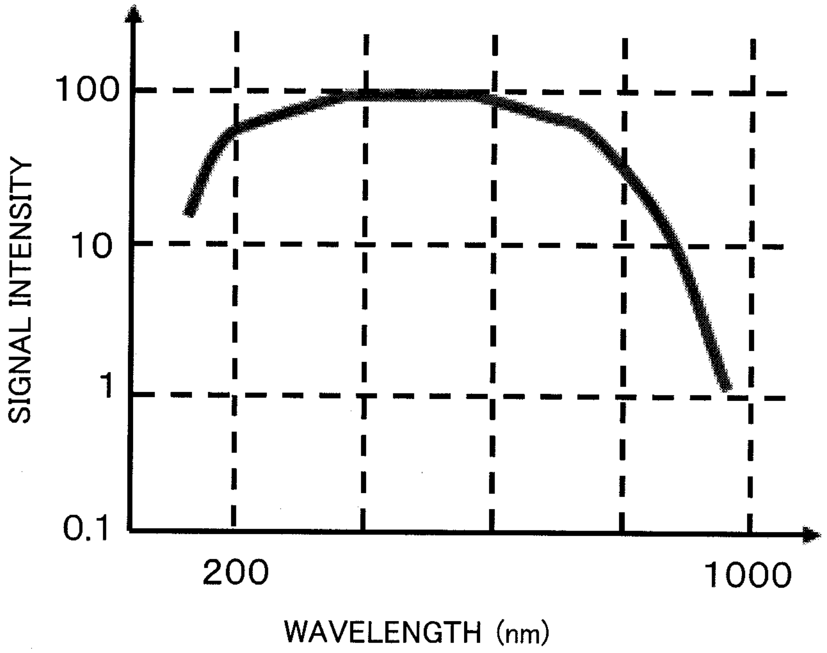
FIG. 9 is a diagram illustrating the intensity of a signal for each of wavelengths of light incident on a photomultiplier per unit amount of light.

FIG. 9 is a diagram illustrating the intensity of a signal for each of wavelengths of light incident on the photomultiplier per unit amount of light. In the present embodiment, the intensity (signal intensity) of an output signal varies in a range of 1 to 100 for a wavelength of incident light so that the difference between the minimum and maximum intensities of the signal is approximately two digits. A specific example of a process to be performed in the aforementioned case is described with the data collecting device according to the first embodiment. It is assumed that when a measurement is performed while changing a wavelength from 200 nm to 700 nm, a voltage of a signal that is output from the photomultiplier changes from 20 mV to 2 V at an input to the A/D converter 111. As described as the example of the first embodiment, it is assumed that the amplifier 101 illustrated in FIG. 1 multiplies the amplitude of a signal by 1, the amplifier 102 multiplies the amplitude of a signal by ¼, the input full scales for the A/D converters are 500 mV, the calculator 121 multiplies the amplitude of the signal by 1, and the calculator 122 multiplies the amplitude of the signal by 4. Since the maximum value of the detected signal is 2 V, the voltage of the signal input to the A/D converter 111 is 2 V that is an over range. Thus, the A/D converter 112 is selected and sampling is performed. Therefore, even when the difference between the maximum and minimum intensities of the signal detected by and output from the photomultiplier included in the photometer is approximately two digits, the signal that has a wavelength in a desired range can be measured without an analog adjustment of a gain.

In another method for using the accumulation memory, when the signal output from the photomultiplier is to be digitized, address spaces of the accumulation memory are associated with sampling times in the same manner as the mass spectrometer and sampling results are stored in the accumulation memory. This method is effective in a case where a characteristic of results of signal detection over time is to be measured when the light source always emits light. When a flashing light source such as a xenon lamp is used as the light source, a signal may be sampled from the time when the light source changes from an extinction state to a lighting state so as to emit light, results of the sampling may be associated with times, and accumulated results over time may be stored in synchronization with the repetitive lighting of the light source.

In the same manner as described above, the data processing device according to any of the second to fourth embodiments can be applied to the photometer.

As described above, a dynamic range for detection of a signal can be easily improved by applying the present invention to the photometer.

REFERENCE SIGNS LIST

1 . . . Introduction unit, 2 . . . TOF unit, 3 . . . Gain adjuster, 4 . . . Ion extraction signal generator, 5 . . . Data collecting circuit, 6 . . . CPU, 7 . . . Input/output device, 21 . . . Detector, 22 . . . Data processing device, 51 . . . Oscillator, 52 . . . Counter, 53 . . . ADC circuit, 111, 112 . . . A/D converter, 101, 102 . . . Amplifier, 121, 122 . . . Calculator, 130 . . . Selector, 140 . . . Accumulation memory, 151 . . . Level determining unit, 150 . . . Switching threshold, 160 . . . Oscillator, 180 . . . Correction control circuit, 181, 182 . . . Correction circuit, 171, 172 . . . Phase adjuster, 191 . . . Counter, 193 . . . Phase adjuster, 131 . . . Calculator, 132 . . . Variable amplifier, 103, 104 . . . Switch, 123, 124 . . . Selector, 141 . . . Controller

The invention claimed is:

1. A signal processing device comprising:

amplifiers that are capable of amplifying a detected signal using amplification factors that are different from each other;

A/D converters that sample plural signals amplified by the amplifiers using the different amplification factors and output from the amplifiers;

calculators that perform, on the basis of the plural amplification factors of the amplifiers, calculation on plural data pieces converted by the A/D converters and output from the A/D converters; and a selector that selects one or more of output data pieces from among plural data pieces output from the calculators; and correction circuits that correct errors between the amplification factors of the amplifiers and amplification factors used by the calculators.

2. The signal processing device according to claim 1, further comprising a level determining unit that selects an output data piece having a high S/N ratio from among the plural data pieces output from the calculators and transmits a data selection signal to the selector.

3. The signal processing device according to claim 1, wherein the selector selects one or more of output data pieces on the basis of S/N ratios of the plural data pieces output from the calculators.

4. The signal processing device according to claim 1, wherein the correction circuits correct the errors between the amplification factors of the amplifiers and the amplification factors used for the plural data pieces output from the calculators, and output the corrected data pieces to the selector.

5. The signal processing device according to claim 4, further comprising a correction control circuit that predetermines the errors between the amplification factors of the amplifiers and the amplification factors used by the calculators and transmits the errors to the correction circuits.

6. The signal processing device according to claim 1, further comprising clock phase adjusters that control, on the basis of a mode, phases of clocks output from an oscillator and transmits the clocks to the A/D converters.

7. The signal processing device according to claim 1, further comprising switches that control, on the basis of a mode, whether or not the plural output signals amplified using the amplification factors are output to the A/D converters.

8. The signal processing device according to claim 1, further comprising a variable amplifier that transmits an ion signal to the amplifiers; and a variable calculator that reduces the amplitude or amplitudes of the one or more of data pieces output from the selector by an amplification factor of the variable amplifier.

9. A mass spectrometer comprising:

an introduction unit that ionizes a sample to be analyzed;

a TOF unit that applies a voltage to the sample ionized by the introduction unit so as to accelerate an ion of the sample and causes the ion of the sample to fly toward a detector; and a signal processing device described in claim 1, wherein the signal processing device processes a detected ion signal output from the TOF unit.

10. A photometer comprising:

a light source that irradiates, with light, a sample to be analyzed;

a photomultiplier that detects a luminous intensity of light having a desired wavelength; and a signal processing device described in claim 1, wherein the signal processing device processes a detected ion signal.

* * * * *